(12) United States Patent
Wu et al.

(10) Patent No.: US 12,030,093 B2
(45) Date of Patent: Jul. 9, 2024

(54) STEAM TREATMENT STATIONS FOR CHEMICAL MECHANICAL POLISHING SYSTEM

(71) Applicant: Applied Materials, Inc., Santa Clara, CA (US)

(72) Inventors: Haosheng Wu, San Jose, CA (US); Jianshe Tang, San Jose, CA (US); Hari Soundararajan, Sunnyvale, CA (US); Shou-Sung Chang, Mountain View, CA (US); Hui Chen, San Jose, CA (US); Chih Chung Chou, San Jose, CA (US); Alexander John Fisher, Santa Clara, CA (US); Paul D. Butterfield, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/889,330

(22) Filed: Aug. 16, 2022

(65) Prior Publication Data
US 2022/0388041 A1 Dec. 8, 2022

Related U.S. Application Data

(62) Division of application No. 16/886,571, filed on May 28, 2020, now Pat. No. 11,446,711.

(60) Provisional application No. 62/854,305, filed on May 29, 2019.

(51) Int. Cl.
*B08B 3/10* (2006.01)
*B24B 37/34* (2012.01)
*H01L 21/67* (2006.01)

(52) U.S. Cl.
CPC .............. *B08B 3/106* (2013.01); *B24B 37/34* (2013.01); *H01L 21/67051* (2013.01); *H01L 21/67248* (2013.01); *B08B 2203/007* (2013.01)

(58) Field of Classification Search
CPC ....................................................... B08B 3/106
See application file for complete search history.

(56) References Cited

U.S. PATENT DOCUMENTS

| | | | |
|---|---|---|---|
| 4,450,652 A | 5/1984 | Walsh | |
| 5,058,194 A | 10/1991 | Violi | |
| 5,088,242 A | 2/1992 | Lubbering et al. | |
| 5,196,353 A | 3/1993 | Sandhu et al. | |
| 5,351,360 A | 10/1994 | Suzuki et al. | |
| 5,467,424 A | 11/1995 | Davies et al. | |

(Continued)

FOREIGN PATENT DOCUMENTS

| | | |
|---|---|---|
| CN | 1539161 | 10/2004 |
| CN | 1835192 | 9/2006 |

(Continued)

OTHER PUBLICATIONS

Banerjee et al., "Post CMP Aqueous and CO2 Cryogenic Cleaning Technologies for Low k and Copper Integration," CMPUG Symposium, Poster Abstract, Jan. 2015, 2 pages.

(Continued)

*Primary Examiner* — Jason Y Ko
(74) *Attorney, Agent, or Firm* — Fish & Richardson P.C.

(57) ABSTRACT

An apparatus for steam treatment of a conditioner head and/or conditioner disk in a chemical mechanical polishing system includes a conditioner cleaning cup, a boiler to generate steam, one or more nozzles positioned to direct steam inwardly into a cavity defined by the load cup, and a supply line running from the boiler to the one or more nozzles to supply steam to the one or more nozzles.

15 Claims, 5 Drawing Sheets

(56) References Cited

U.S. PATENT DOCUMENTS

| | | |
|---|---|---|
| 5,597,442 A | 1/1997 | Chen et al. |
| 5,643,050 A | 7/1997 | Chen |
| 5,709,593 A | 1/1998 | Guthrie |
| 5,722,875 A | 3/1998 | Iwashita et al. |
| 5,738,574 A | 4/1998 | Tolles et al. |
| 5,762,544 A | 6/1998 | Zuniga et al. |
| 5,765,394 A | 6/1998 | Rhoades |
| 5,851,135 A | 12/1998 | Sandhu et al. |
| 5,851,846 A | 12/1998 | Matsui et al. |
| 5,868,003 A | 2/1999 | Simas et al. |
| 5,873,769 A | 2/1999 | Chiou et al. |
| 5,957,750 A | 9/1999 | Brunelli |
| 5,964,952 A | 10/1999 | Kunze-Concewitz |
| 6,000,997 A | 12/1999 | Kao et al. |
| 6,012,967 A | 1/2000 | Satake et al. |
| 6,023,941 A | 2/2000 | Rhoades |
| 6,095,898 A | 8/2000 | Hennofer et al. |
| 6,121,144 A | 9/2000 | Marcyk et al. |
| 6,151,913 A | 11/2000 | Lewis et al. |
| 6,159,073 A | 12/2000 | Wiswesser et al. |
| 6,206,760 B1 | 3/2001 | Chang et al. |
| 6,257,954 B1 | 7/2001 | Ng et al. |
| 6,257,955 B1 | 7/2001 | Springer et al. |
| 6,264,789 B1 | 7/2001 | Pandey et al. |
| 6,280,289 B1 | 8/2001 | Wiswesser et al. |
| 6,315,635 B1 | 11/2001 | Lin |
| 6,332,835 B1 | 12/2001 | Nishimura et al. |
| 6,399,501 B2 | 6/2002 | Birang et al. |
| 6,422,927 B1 | 7/2002 | Zuniga |
| 6,460,552 B1 | 10/2002 | Lorimer |
| 6,461,980 B1 | 10/2002 | Cheung et al. |
| 6,494,765 B2 | 12/2002 | Gitis et al. |
| 6,508,258 B1 | 1/2003 | Lorimer |
| 6,543,251 B1 | 4/2003 | Gasteyer, III et al. |
| 6,640,151 B1 | 10/2003 | Somekh et al. |
| 6,647,309 B1 | 11/2003 | Bone |
| 6,776,692 B1 | 8/2004 | Zuniga et al. |
| 6,829,559 B2 | 12/2004 | Bultman et al. |
| 7,008,295 B2 | 3/2006 | Wiswesser et al. |
| 7,016,750 B2 | 3/2006 | Steinkirchner et al. |
| 7,196,782 B2 | 3/2007 | Fielden et al. |
| 7,797,855 B2 | 9/2010 | Fukuoka et al. |
| 8,658,937 B2 | 2/2014 | Harte et al. |
| 9,005,999 B2 | 4/2015 | Xu et al. |
| 9,475,167 B2 | 10/2016 | Maruyama et al. |
| 9,579,768 B2 | 2/2017 | Motoshima et al. |
| 9,630,295 B2 | 4/2017 | Peng et al. |
| 9,782,870 B2 | 10/2017 | Maruyama et al. |
| 10,002,777 B2 | 6/2018 | Kweon et al. |
| 10,035,238 B2 | 7/2018 | Maruyama et al. |
| 11,446,711 B2 | 9/2022 | Wu et al. |
| 2001/0019937 A1 | 9/2001 | Elledge |
| 2001/0055940 A1 | 12/2001 | Swanson |
| 2002/0039874 A1 | 4/2002 | Hecker et al. |
| 2002/0058469 A1 | 5/2002 | Pinheiro et al. |
| 2003/0055526 A1 | 3/2003 | Avanzino et al. |
| 2003/0211816 A1 | 11/2003 | Liu et al. |
| 2004/0029494 A1 | 2/2004 | Banerjee et al. |
| 2004/0097176 A1 | 5/2004 | Cron |
| 2005/0024047 A1 | 2/2005 | Miller et al. |
| 2005/0042877 A1 | 2/2005 | Salfelder et al. |
| 2005/0058194 A1 | 3/2005 | Yousef |
| 2005/0211377 A1 | 9/2005 | Chen et al. |
| 2006/0030165 A1 | 2/2006 | Ingle et al. |
| 2007/0238395 A1 | 10/2007 | Kimura et al. |
| 2009/0258573 A1 | 10/2009 | Muldowney et al. |
| 2010/0047424 A1 | 2/2010 | Cousin et al. |
| 2010/0081360 A1 | 4/2010 | Xu et al. |
| 2010/0227435 A1 | 9/2010 | Park et al. |
| 2010/0279435 A1 | 11/2010 | Xu et al. |
| 2010/0291841 A1 | 11/2010 | Sung et al. |
| 2011/0159782 A1 | 6/2011 | Sone et al. |
| 2012/0034846 A1 | 2/2012 | Minamihaba et al. |
| 2012/0040592 A1 | 2/2012 | Chen et al. |
| 2012/0190273 A1 | 7/2012 | Ono et al. |
| 2013/0023186 A1 | 1/2013 | Motoshima et al. |
| 2013/0045596 A1 | 2/2013 | Eda et al. |
| 2013/0331005 A1 | 12/2013 | Gawase et al. |
| 2014/0187122 A1 | 7/2014 | Ishibashi |
| 2014/0323017 A1 | 10/2014 | Tang et al. |
| 2015/0090694 A1 | 4/2015 | Hashimoto et al. |
| 2015/0196988 A1 | 7/2015 | Watanabe |
| 2015/0224621 A1 | 8/2015 | Motoshima et al. |
| 2015/0224623 A1 | 8/2015 | Xu et al. |
| 2017/0081065 A1 | 3/2017 | Fitzgerald et al. |
| 2017/0232572 A1 | 8/2017 | Brown |
| 2017/0317234 A1 | 11/2017 | Takeda et al. |
| 2017/0320188 A1 | 11/2017 | Kweon et al. |
| 2018/0236631 A1 | 8/2018 | Eto et al. |
| 2018/0281150 A1 | 10/2018 | Chen et al. |
| 2019/0096708 A1 | 3/2019 | Sharma |
| 2019/0143476 A1 | 5/2019 | Wu |
| 2020/0001426 A1 | 1/2020 | Soundararajan et al. |
| 2020/0001427 A1 | 1/2020 | Soundararajan et al. |
| 2020/0262024 A1 | 8/2020 | Chang et al. |
| 2020/0376522 A1 | 12/2020 | Wu et al. |
| 2020/0376523 A1 | 12/2020 | Wu et al. |
| 2020/0376626 A1 | 12/2020 | Wu et al. |
| 2020/0406310 A1 | 12/2020 | Soundararajan et al. |
| 2021/0280410 A1 | 9/2021 | Otsuji |
| 2023/0249225 A1 | 8/2023 | Wu et al. |
| 2023/0256562 A1 | 8/2023 | Wu et al. |

FOREIGN PATENT DOCUMENTS

| | | |
|---|---|---|
| CN | 202088090 | 12/2011 |
| CN | 104205304 | 12/2014 |
| CN | 106466805 | 3/2017 |
| CN | 206541804 | 10/2017 |
| CN | 207171777 | 4/2018 |
| CN | 108526166 | 9/2018 |
| CN | 109585249 | 4/2019 |
| CN | 109666897 | 4/2019 |
| CN | 109772783 | 5/2019 |
| DE | 3532261 | 3/1987 |
| EP | 0323939 | 6/1992 |
| JP | S60-1485 | 1/1985 |
| JP | H11-033897 | 2/1999 |
| JP | H11-251275 | 9/1999 |
| JP | 2001-030169 | 2/2001 |
| JP | 2003-071709 | 3/2003 |
| JP | 2003-197586 | 7/2003 |
| JP | 2004-202666 | 7/2004 |
| JP | 2004-306173 | 11/2004 |
| JP | 2005-311246 | 11/2005 |
| JP | 2007-035973 | 2/2007 |
| JP | 2013-042066 | 2/2013 |
| JP | 2018-046260 | 3/2018 |
| JP | 2019-063792 | 4/2019 |
| KR | 10-2000- 0025767 | 5/2000 |
| KR | 20-0241537 | 10/2001 |
| KR | 20-0326835 | 9/2003 |
| KR | 2006-0076332 | 7/2006 |
| KR | 2009-0046468 | 5/2009 |
| KR | 2012-0084671 | 7/2012 |
| KR | 10-1816694 | 1/2018 |
| KR | 2020-0056015 | 5/2020 |
| TW | 436916 | 5/2001 |
| TW | 201446421 | 12/2014 |
| TW | 201733736 | 10/2017 |
| TW | 201802994 | 1/2018 |
| TW | 201919102 | 5/2019 |
| WO | WO 97/21057 | 6/1997 |
| WO | WO 1997/021057 | 6/1997 |
| WO | WO 2002/017411 | 2/2002 |
| WO | WO 2014/113220 | 7/2014 |
| WO | WO 2018/144107 | 8/2018 |

OTHER PUBLICATIONS

International Search Report and Written Opinion in International Appln. No. PCT/US2020/034936, dated Sep. 15, 2020, 11 pages.

(56) References Cited

OTHER PUBLICATIONS

Sampurno et al., "Pad Surface Thermal Management during Copper Chemical Mechanical Planarization," Presented Oct. 1, 2015, at lie International Conference on Planarization/CMP Technology, 2015, Sep. 30-Oct. 2, 2015, Session D-4, Chandler, AZ, USA, 24 pages.
Wu et al., "Pad Surface Thermal Management during Copper Chemical: Mechanical. Planarization," ECS Journal of Solid State Science and Technology, Apr. 2015, 4(7):P206-12.
Office Action in Chinese Appln. No. 2020800389367, dated Jun. 29, 2023, 12 pages (with English translation).
Office Action in Taiwanese Appln. No. 109117422, dated Mar. 28, 2024, 14 pages (with English summary and search report).
Office Action in Chinese Appln. No. 202080038936.7, Mar. 23, 2024, 12 pages (with English translation).
Office Action in Japanese Appln. No. 2021-569292, dated May 7, 2024, 8 pages (with English translation).

STEAM TREATMENT STATIONS FOR CHEMICAL MECHANICAL POLISHING SYSTEM

CROSS-REFERENCE TO RELATED APPLICATIONS

This application is a divisional of U.S. application Ser. No. 16/886,571, filed on May 28, 2020, which claims priority to U.S. Provisional Application Ser. No. 62/854,305, filed on May 29, 2019, the entire disclosures of which are incorporated by reference.

TECHNICAL FIELD

The present disclosure relates to chemical mechanical polishing (CMP), and more specifically to the use of steam for cleaning or preheating during CMP.

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

SUMMARY

In one aspect, an apparatus for steam treatment of a carrier head or a substrate in a chemical mechanical polishing system includes a load cup, a pedestal in a cavity defined by the load cup, the pedestal configured to receive a substrate from or supply a substrate to a carrier head, a boiler to generate steam, one or more nozzles positioned to direct steam inwardly into the cavity defined by the load cup, and a supply line running from the boiler to the one or more nozzles to supply steam to the one or more nozzles.

Implementations can include one or more of the following features.

A motor can rotate the carrier head when the carrier head is within the load cup.

An actuator can lift or lower the carrier head within the load cup.

A temperature sensor can monitor a temperature of the carrier head and/or substrate. A controller can be configured to receive the temperature from the sensor and to halt a flow of steam when the carrier head or substrate reaches a target temperature.

A controller can be configured to start a timer when the steam begins to flow onto the carrier head or substrate and to halt the flow of steam when the timer expires.

The one or more nozzles can include a first nozzle, and can further include a controller configured to cause steam to flow through the first nozzle onto an outer surface of the carrier head when the carrier head is positioned in the load cup.

The one or more nozzles can include a second nozzle, and can further include a controller configured to cause steam to flow through the second nozzle onto an interior surface of the carrier head when the substrate is positioned on the pedestal.

The controller can be configured to cause steam to flow through the second nozzle onto a bottom surface of the substrate when the substrate is loaded in the carrier head.

The one or more nozzles can include a third nozzle and a fourth nozzle, and can further include a controller configured to cause steam to flow through the third nozzle onto a top surface of the substrate when the substrate is positioned on the pedestal. The one or more nozzles can include a fourth nozzle, and the controller can be configured to cause steam to flow through the fourth nozzle onto a bottom surface of the substrate when the substrate is positioned on the pedestal.

In one aspect, a method of steam treatment of a carrier head or a substrate in a chemical mechanical polishing system includes receiving a carrier head and/or substrate in a substrate loading cup of the a chemical mechanical polishing system, and directing steam onto the carrier head and/or substrate in the loading cup to clean and/or preheat the carrier head and/or substrate.

In one aspect, an apparatus for steam treatment of a conditioner head and/or conditioner disk in a chemical mechanical polishing system includes a conditioner cleaning cup, a boiler to generate steam, one or more nozzles positioned to direct steam inwardly into a cavity defined by the load cup, and a supply line running from the boiler to the one or more nozzles to supply steam to the one or more nozzles.

Implementations can include one or more of the following features.

A temperature sensor can monitor a temperature of the conditioner head and/or conditioner disk. A controller can be configured to receive the temperature from the sensor and to halt a flow of steam to the conditioner head or conditioner disk when the conditioner head or conditioner disk reaches a target temperature.

A controller can be configured to start a timer when the steam begins to flow onto conditioner head or conditioner disk and to halt the flow of steam when the timer expires.

The one or more nozzles can include a first nozzle, and can further include a controller configured to cause steam to flow through the first nozzle onto a bottom surface of the conditioner disk when the conditioner head is positioned in the cleaning cup.

The one or more nozzles can include a second nozzle, and can further include a controller configured to cause steam to flow through the second nozzle onto an outer surface of the conditioner head when the conditioner head is positioned in the cleaning cup.

In one aspect, a method of steam treatment of a conditioner head and/or conditioner disk in a chemical mechanical polishing system includes: receiving a conditioner head in a conditioner cleaning cup of the a chemical mechanical polishing system, and directing steam onto the conditioner head and/or conditioner disk in the cleaning cup to clean and/or preheat the conditioner head and/or conditioner disk.

Possible advantages may include, but are not limited to, one or more of the following.

Steam, i.e., gaseous $H_2O$ generated by boiling, can be generated in sufficient quantities with low levels of contaminants. Additionally, a steam generator can generate steam that is substantially pure gas, e.g., has little to no suspended liquid in the steam. Such steam, also known as dry steam, can provide a gaseous form of $H_2O$ that has a higher energy transfer and lower liquid content than other steam alternatives such as flash steam.

Various components of a CMP apparatus can be quickly and efficiently cleaned. Steam can be more effective than liquid water in dissolving or otherwise removing polishing by-products, dried slurry, debris, etc., from surfaces in the polishing system. Thus, defects on the substrate can be reduced.

Various components of a CMP apparatus can be preheated. Temperature variation across the polishing pad and thus across the substrate can be reduced, thereby reducing within-wafer non-uniformity (WIWNU). Temperature variation over a polishing operation can be reduced. This can improve predictability of polishing during the CMP process. Temperature variations from one polishing operation to another polishing operation can be reduced. This can improve wafer-to-wafer uniformity.

The details of one or more implementations are set forth in the accompanying drawings and the description below. Other aspects, features, and advantages will be apparent from the description and drawings, and from the claims.

DETAILED DESCRIPTION

Chemical mechanical polishing operates by a combination of mechanical abrasion and chemical etching at the interface between the substrate, polishing liquid, and polishing pad. During the polishing process, a significant amount of heat is generated due to friction between the surface of the substrate and the polishing pad. In addition, some processes also include an in-situ pad conditioning step in which a conditioning disk, e.g., a disk coated with abrasive diamond particles, is pressed against the rotating polishing pad to condition and texture the polishing pad surface. The abrasion of the conditioning process can also generate heat. For example, in a typical one minute copper CMP process with a nominal downforce pressure of 2 psi and removal rate of 8000 Å/min, the surface temperature of a polyurethane polishing pad can rise by about 30° C.

On the other hand, if the polishing pad has been heated by previous polishing operations, when a new substrate is initially lowered into contact with the polishing pad, it is at a lower temperature, and thus can act as a heat sink. Similarly, slurry dispensed onto the polishing pad can act as a heat sink. Overall, these effects result in variation of the temperature of the polishing pad spatially and over time.

Both the chemical-related variables in a CMP process, e.g., as the initiation and rates of the participating reactions, and the mechanical-related variables, e.g., the surface friction coefficient and viscoelasticity of the polishing pad, are strongly temperature dependent. Consequently, variation in the surface temperature of the polishing pad can result in changes in removal rate, polishing uniformity, erosion, dishing, and residue. By more tightly controlling the temperature of the surface of the polishing pad during polishing, variation in temperature can be reduced, and polishing performance, e.g., as measured by within-wafer non-uniformity or wafer-to-wafer non-uniformity, can be improved.

Furthermore, debris and slurry can accumulate on various components of the CMP apparatus during CMP. If these polishing by-products later come loose from the components, they can scratch or otherwise damage the substrate, resulting in an increase in polishing defects. Water jets have been used to clean various components of the CMP apparatus system. However, a large quantity of water is needed to perform this task.

A technique that could address one or more of these issues is to clean and/or pre-heat various components of the CMP apparatus using steam, i.e., gaseous $H_2O$ generated by boiling. Less steam may be required to impart an equivalent amount of energy as hot water, e.g., due to the latent heat of the steam. Additionally, steam can be sprayed at high velocities to clean and/or preheat the components. In addition, steam can be more effective than liquid water in dissolving or otherwise removing polishing by-products.

Figure 1:
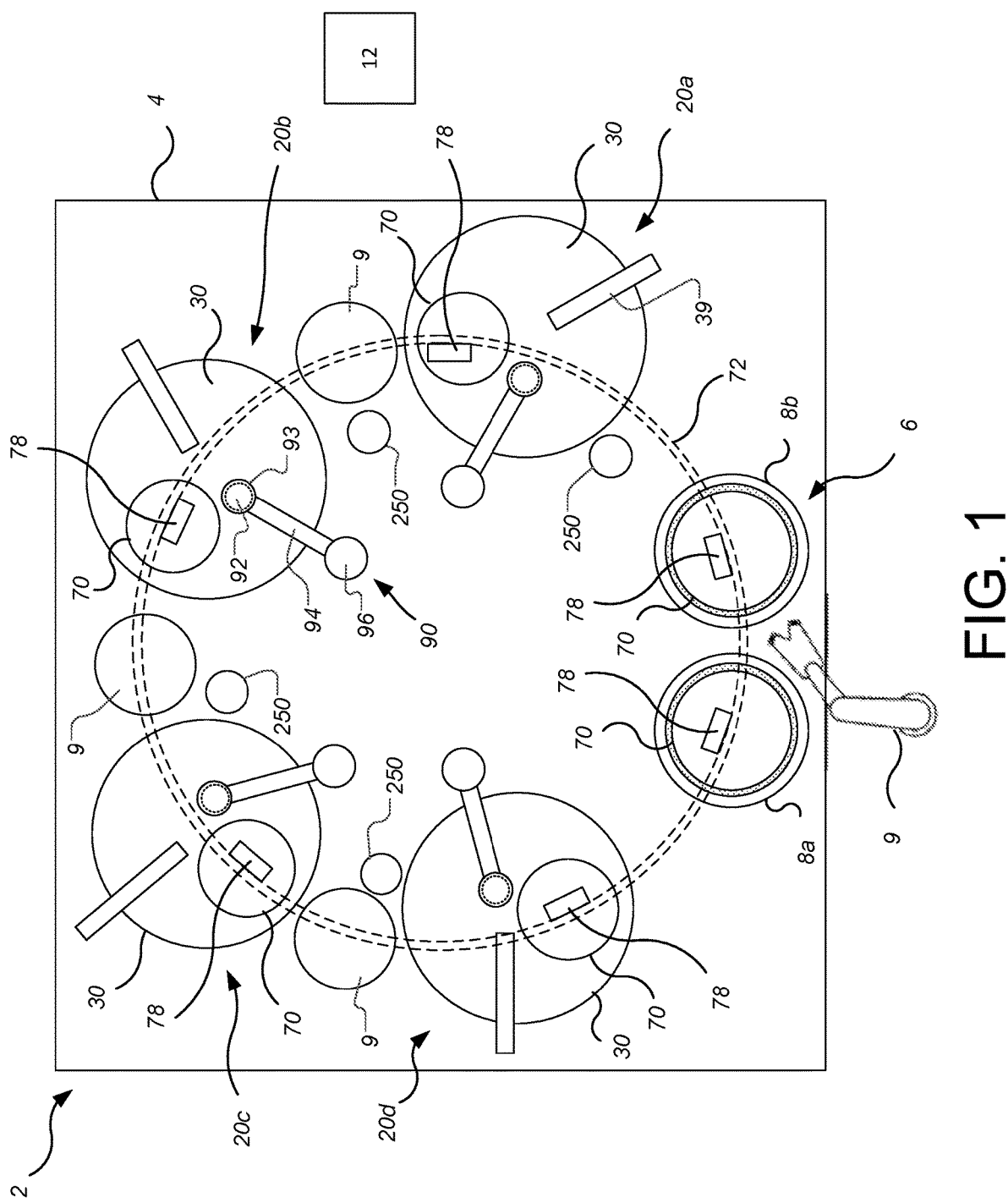
FIG. 1 is a schematic plan view of an example of a polishing apparatus.

FIG. 1 is a plan view of a chemical mechanical polishing apparatus 2 for processing one or more substrates. The polishing apparatus 2 includes a polishing platform 4 that at least partially supports and houses a plurality of polishing stations 20. For example, the polishing apparatus can include four polishing stations 20a, 20b, 20c and 20d. Each polishing station 20 is adapted to polish a substrate that is retained in a carrier head 70. Not all components of each station are illustrated in FIG. 1.

The polishing apparatus 2 also includes a multiplicity of carrier heads 70, each of which is configured to carry a substrate. The polishing apparatus 2 also includes a transfer station 6 for loading and unloading substrates from the carrier heads. The transfer station 6 can include a plurality of load cups 8, e.g., two load cups 8a, 8b, adapted to facilitate transfer of a substrate between the carrier heads 70 and a factory interface (not shown) or other device (not shown) by a transfer robot 9. The load cups 8 generally facilitate transfer between the robot 9 and each of the carrier heads 70 by loading and unloading the carrier heads 70.

The stations of the polishing apparatus 2, including the transfer station 6 and the polishing stations 20, can be positioned at substantially equal angular intervals around the center of the platform 4. This is not required, but can provide the polishing apparatus with a good footprint.

For a polishing operation, one carrier head 70 is positioned at each polishing station. Two additional carrier heads can be positioned in the loading and unloading station 6 to exchange polished substrates for unpolished substrates while the other substrates are being polished at the polishing stations 20.

The carrier heads 70 are held by a support structure that can cause each carrier head to move along a path that passes, in order, the first polishing station 20a, the second polishing station 20b, the third polishing station 20c, and the fourth polishing station 20d. This permits each carrier head to be selectively positioned over the polishing stations 20 and the load cups 8.

In some implementations, each carrier head 70 is coupled to a carriage 78 that is mounted to a support structure 72. By moving a carriage 78 along the support structure 72, e.g., a track, the carrier head 70 can be positioned over a selected polishing station 20 or load cup 8. Alternatively, the carrier heads 70 can be suspended from a carousel, and rotation of the carousel moves all of the carrier heads simultaneously along a circular path.

Each polishing station 20 of the polishing apparatus 2 can include a port, e.g., at the end of a slurry supply arm 39, to dispense polishing liquid 38 (see FIG. 3A), such as abrasive slurry, onto the polishing pad 30. Each polishing station 20 of the polishing apparatus 2 can also include pad conditioner 93 to abrade the polishing pad 30 to maintain the polishing pad 30 in a consistent abrasive state.

Figure 3A:
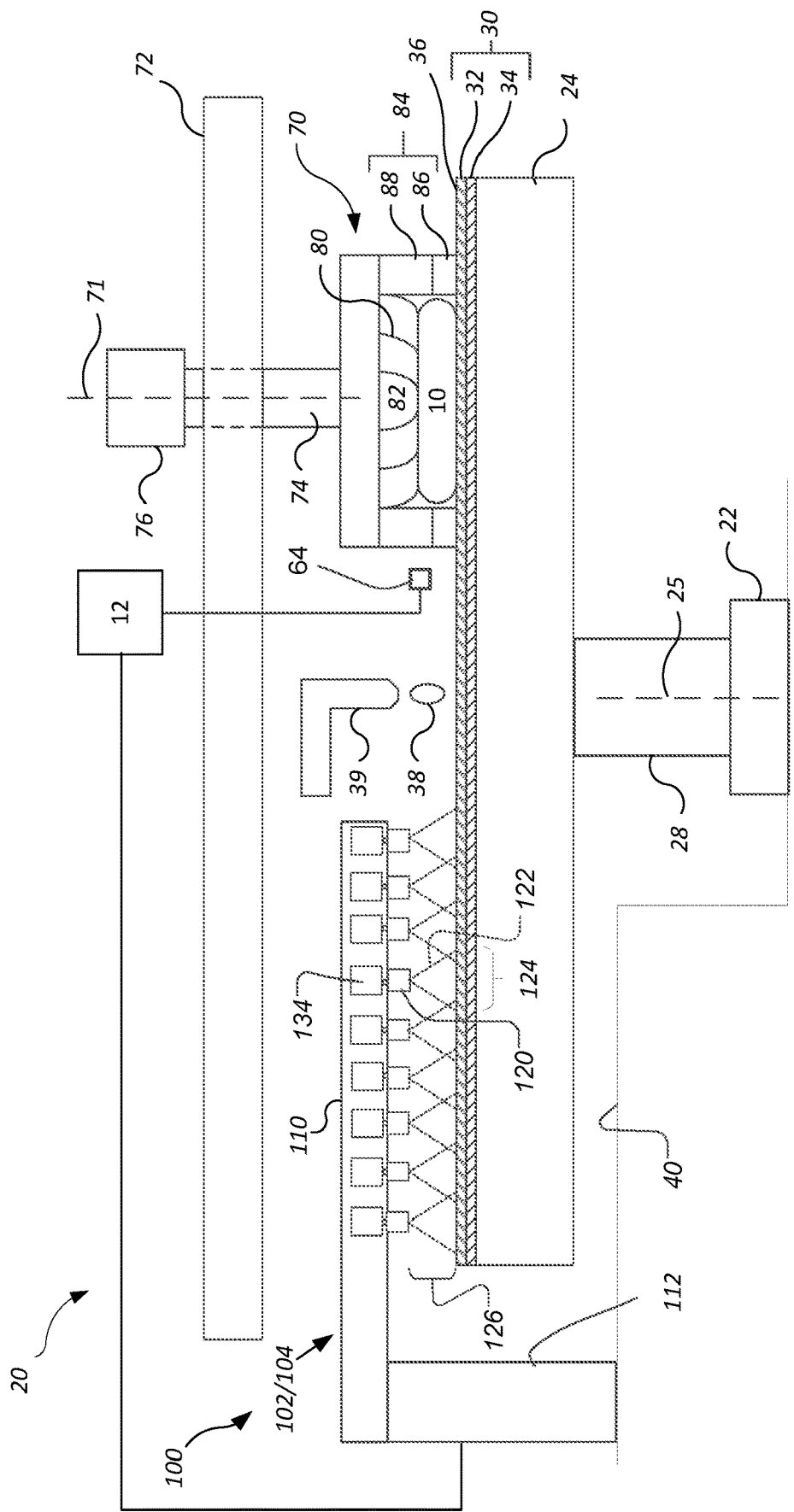
FIG. 3A is a schematic cross-sectional view of an example of a polishing station of the polishing apparatus.
Figure 3B:
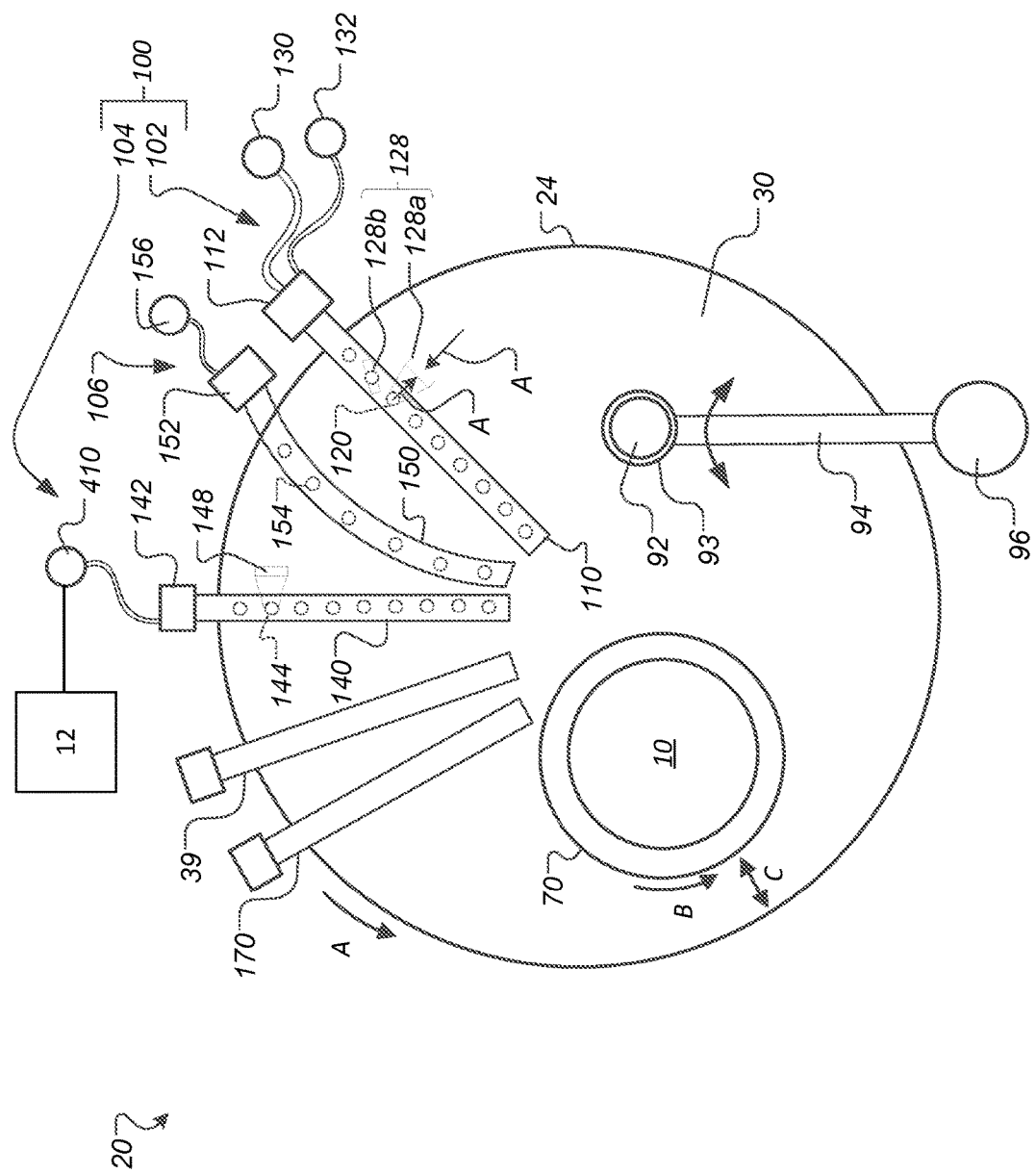
FIG. 3B is a schematic top view of an example polishing station of the chemical mechanical polishing apparatus.

FIGS. 3A and 3B illustrate an example of a polishing station 20 of a chemical mechanical polishing system. The polishing station 20 includes a rotatable disk-shaped platen 24 on which a polishing pad 30 is situated. The platen 24 is operable to rotate (see arrow A in FIG. 3B) about an axis 25. For example, a motor 22 can turn a drive shaft 28 to rotate the platen 24. The polishing pad 30 can be a two-layer polishing pad with an outer polishing layer 34 and a softer backing layer 32.

Referring to FIGS. 1, 3A and 3B, the polishing station 20 can include a supply port, e.g., at the end of a slurry supply arm 39, to dispense a polishing liquid 38, such as an abrasive slurry, onto the polishing pad 30.

The polishing station 20 can include a pad conditioner 90 with a conditioner disk 92 (see FIG. 2B) to maintain the surface roughness of the polishing pad 30. The conditioner disk 92 can be positioned in a conditioner head 93 at the end of an arm 94. The arm 94 and conditioner head 93 are supported by a base 96. The arm 94 can swing so as to sweep the conditioner head 93 and conditioner disk 92 laterally across the polishing pad 30. A cleaning cup 255 can be located adjacent the platen 24 at a position to which the arm 94 can move the conditioner head 93.

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head 70 can include a retaining ring 84 to hold the substrate. In some implementations, the retaining ring 84 may include a lower plastic portion 86 that contacts the polishing pad, and an upper portion 88 of a harder material, e.g., a metal.

In operation, the platen is rotated about its central axis 25, and the carrier head is rotated about its central axis 71 (see arrow B in FIG. 3B) and translated laterally (see arrow C in FIG. 3B) across the top surface of the polishing pad 30.

Referring to FIGS. 3A and 3B, as the carrier head 70 sweeps across the polishing pad 30, any exposed surfaces of the carrier head 70 tend to become covered with slurry. For example, slurry can stick to the outer or inner diameter surface of the retaining ring 84. In general, for any surfaces that are not maintained in a wet condition, the slurry will tend to coagulate and/or dry out. As a result, particulates can form on the carrier head 70. If these particulates become dislodged, the particulates can scratch the substrate, resulting in polishing defects.

Moreover, the slurry can cake onto the carrier head 70, or the sodium hydroxide in the slurry can crystallize on one of the surfaces of the carrier head 70 and/or the substrate 10 and cause the surface of the carrier head 70 to be corrode. The caked-on slurry is difficult to remove and the crystallized sodium hydroxide is difficult to return to a solution.

Similar problems occur with the conditioner head 92, e.g., particulates can form on the conditioner head 92, the slurry can cake onto the conditioner head 92, or the sodium hydroxide in the slurry can crystallize on one of the surfaces of the conditioner head 92.

One solution is to clean the components, e.g., the carrier head 70 and conditioner head 92, with a liquid water jet. However, the components can be difficult to clean with a water jet alone, and a substantial amount of water may be necessary. Additionally, the components that contact the polishing pad 30, e.g., the carrier head 70, substrate 10 and conditioner disk 92, can act as heat sinks that hinder uniformity of the polishing pad temperature.

Figure 2A:
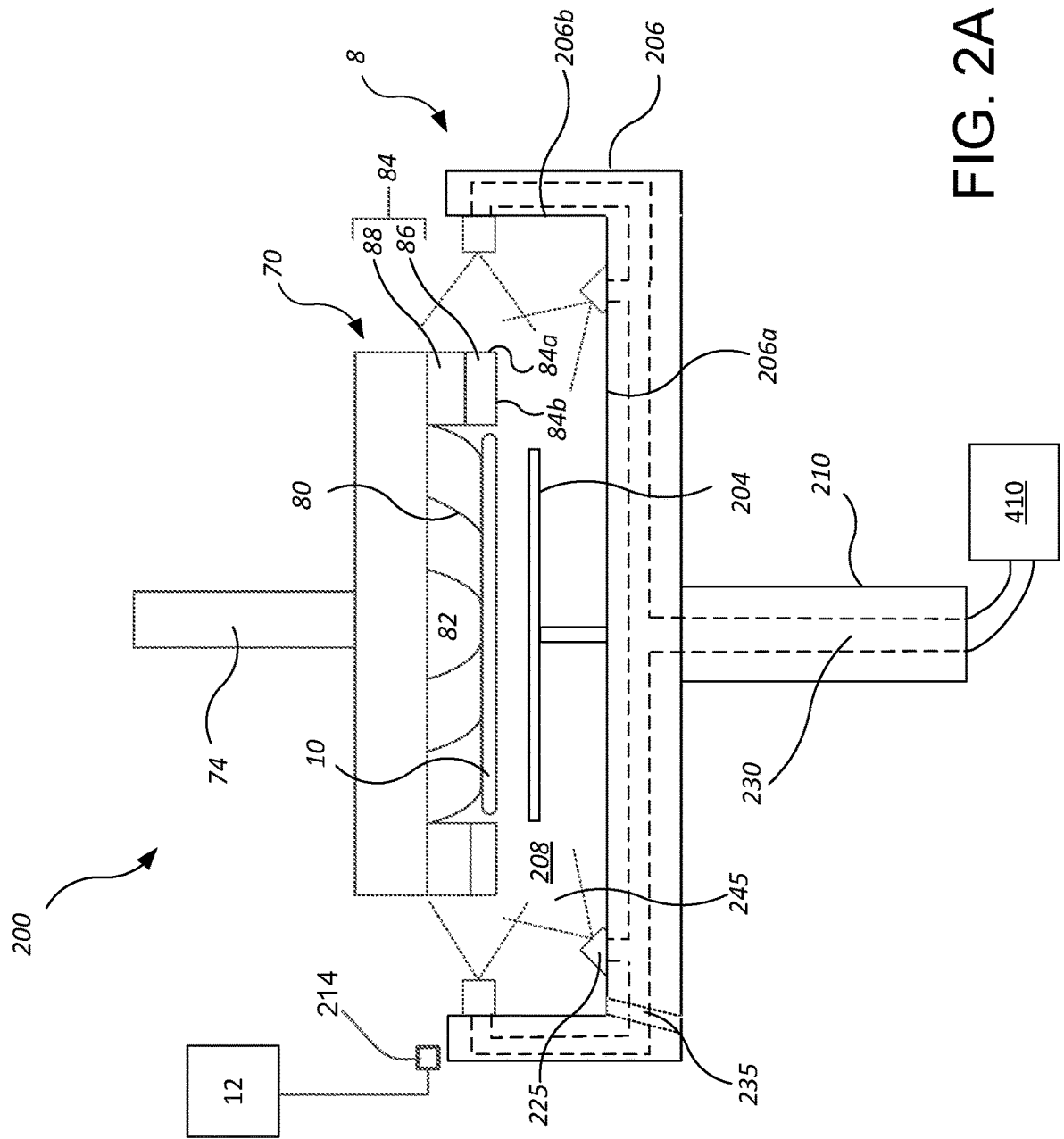
FIG. 2A is a schematic cross-sectional view of an example carrier head steam treating assembly.

To address these problems, as shown in the FIG. 2A, the polishing apparatus 2 includes one or more carrier head steam treating assemblies 200. Each steam treating assembly 200 can be used for cleaning and/or pre-heating of the carrier head 70 and substrate 10.

A steam treating assembly 200 can be part of the load cup 8, e.g., part of the load cup 8a or 8b. Alternatively or in addition, a steam treating assembly 200 can be provided at one or more inter-platen stations 9 located between adjacent polishing stations 20.

The load cup 8 includes a pedestal 204 to hold the substrate 10 during a loading/unloading process. The load cup 8 also includes a housing 206 that surrounds or substantially surrounds the pedestal 204. Multiple nozzles 225 are supported by the housing 206 or a separate support to deliver steam 245 to a carrier head and/or substrate positioned in a cavity 208 defined by the housing 206. For example, nozzles 225 can be positioned on one or more interior surfaces of the housing 206, e.g., a floor 206a and/or a side wall 206b and/or or a ceiling of the cavity. The nozzles 225 can be oriented to direct steam inwardly into the cavity 206. The steam 245 can be generated by using the steam generator 410, e.g., a boiler such as a flash boiler or a regular boiler. A drain 235 can permit excess water, cleaning solution, and cleaning by-product to pass through to prevent accumulation in the load cup 8.

An actuator provides relative vertical motion between the housing 206 and the carrier head 70. For example, a shaft 210 can support the housing 206 and be vertically actuatable to raise and lower the housing 206. Alternatively, the carrier head 70 can move vertically. The pedestal 204 can be on-axis with the shaft 210. The pedestal 204 can be vertically movable relative to the housing 206.

In operation, the carrier head 70 can be positioned over the load cup 8, and the housing 206 can be raised (or the carrier head 70 lowered) so that the carrier head 70 is partially within the cavity 208. A substrate 10 can begin on the pedestal 204 and be chucked onto the carrier head 70, and/or begin on the carrier head 70 and be dechucked onto the pedestal 204.

Steam is directed through the nozzles 225 to clean and/or preheat one or more surfaces of the substrate 10 and/or carrier head 70. For example, one or more of the nozzles can be positioned to direct steam onto the outer surface of the carrier head 70, the outer surface 84*a* of the retaining ring 84, and/or the bottom surface 84*b* of the retaining ring 84. One or more of the nozzles can be positioned to direct steam onto a front surface of a substrate 10 being held by the carrier head 70, i.e., the surface to be polished, or onto the bottom surface of the membrane 80 if no substrate 10 is being supported on the carrier head 70. One or more nozzles can be positioned below the pedestal 204 to direct steam upward onto the front surface of a substrate 10 positioned on pedestal 204. One or more nozzles can be positioned above the pedestal 204 to direct steam downward onto a back surface of a substrate 10 positioned on pedestal 204. The carrier head 70 can rotate within the load cup 8 and/or move vertically relative to the load cup 8 to allow the nozzles 225 to treat different areas of the carrier head 70 and/or substrate 10. The substrate 10 can rest on the pedestal 204 to allow for the interior surfaces of the carrier head 70 to be steam treated, e.g., the bottom surface of the membrane 80, or the inner surfaces of the retaining ring 84.

Steam is circulated from a steam source through a supply line 230 through the housing 206 to the nozzles 225. The nozzles 225 can spray steam 245 to remove organic residues, by-product, debris, and slurry particles left on the carrier head 70 and the substrate 10 after each polishing operation. The nozzles 225 can spray steam 245 to heat the substrate 10 and/or carrier head 70.

An inter-platen station 9 can be constructed and operated similarly, but need not have a substrate support pedestal.

The steam 245 delivered by the nozzles 225 can have an adjustable temperature, pressure, and flow rate to vary the cleaning and preheating of the carrier head 70 and the substrate 10. In some implementations, the temperature, pressure and/or flow rate can be independently adjustable for each nozzle or between groups of nozzles.

For example, the temperature of the steam 245 can be 90 to 200° C. when the steam 245 is generated (e.g., in the steam generator 410). The temperature of the steam 245 can be between 90 to 150° C. when the steam 245 is dispensed by the nozzles 225, e.g., due to heat loss in transit. In some implementations, steam is delivered by the nozzles 225 at a temperature of 70-100° C., e.g., 80-90° C. In some implementations, the steam delivered by the nozzles is superheated, i.e., is at a temperature above the boiling point. The flow rate of the steam 245 can be 1-1000 cc/minute when the steam 245 is delivered by the nozzles 225, depending on heater power and pressure. In some implementations, the steam is mixed with other gases, e.g., is mixed with normal atmosphere or with $N_2$. Alternatively, the fluid delivered by the nozzles 225 is substantially purely water. In some implementations, the steam 245 delivered by the nozzles 225 is mixed with liquid water, e.g., aerosolized water. For example, liquid water and steam can be combined at a relative flow ratio (e.g., with flow rates in sccm) 1:1 to 1:10. However, if the amount of liquid water is low, e.g., less than 5 wt %, e.g., less than 3 wt %, e.g., less than 1 wt %, then the steam will have superior heat transfer qualities. Thus, in some implementations the steam is dry steam, i.e., is substantially free of water droplets.

To avoid degrading the membrane with heat, water can be mixed with the steam 245 to reduce the temperature, e.g., to around 40-50° C. The temperature of the steam 245 can be reduced by mixing cooled water into the steam 245, or mixing water at the same or substantially the same temperature into the steam 245 (as liquid water transfers less energy than gaseous water).

In some implementations, a temperature sensor 214 can be installed in or adjacent the steam treating assembly 200 to detect the temperature of the carrier head 70 and/or the substrate 10. A signal from the sensor 214 can be received by a controller 12 to monitor the temperature of the carrier head 70 and/or the substrate 10. The controller 12 can control delivery of the steam by the assembly 100 based on the temperature measurement from the temperature sensor 214. For example, the controller can receive a target temperature value. If the controller 12 detects that the temperature measurement exceeds a target value, the controller 12 halt the flow of steam. As another example, the controller 12 can reduce the steam delivery flow rate and/or reduce the steam temperature, e.g., to prevent overheating of the components during cleaning and/or preheating.

In some implementations, the controller 12 includes a timer. In this case, the controller 12 can start when delivery of the steam begins, and can halt delivery of steam upon expiration of the timer. The timer can be set based on empirical testing to attain a desired temperature of the carrier head 70 and substrate 10 during cleaning and/or preheating.

Figure 2B:
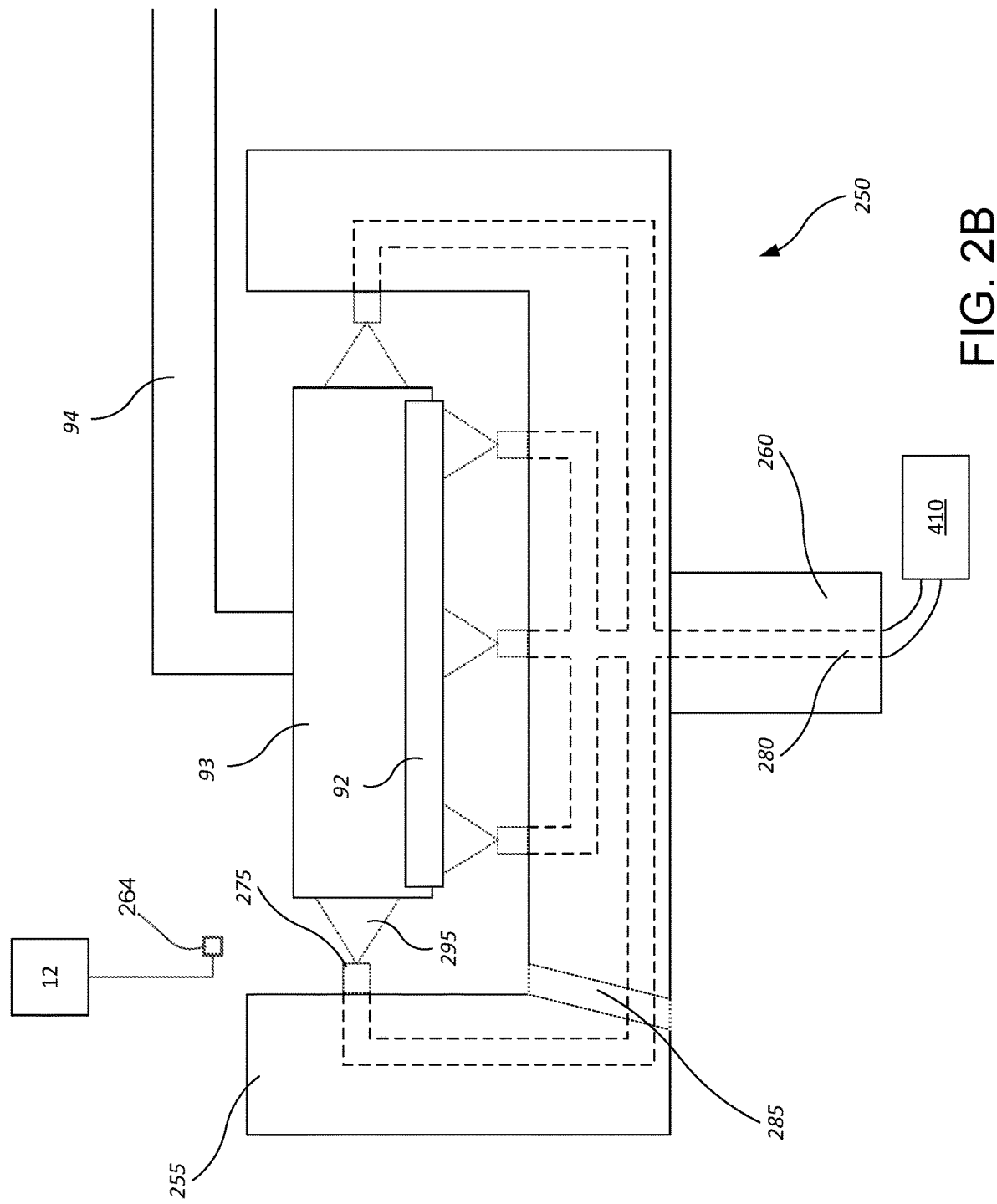
FIG. 2B is a schematic cross-sectional view of an example conditioning head steam treating assembly.

FIG. 2B shows a conditioner steam treating assembly 250 that includes a housing 255. The housing 255 can form of a "cup" to receive the conditioner disk 92 and conditioner head 93. Steam is circulated through a supply line 280 in the housing 255 to one or more nozzles 275. The nozzles 275 can spray steam 295 to remove polishing by-product, e.g., debris or slurry particles, left on the conditioner disk 92 and/or conditioner head 93 after each conditioning operation. The nozzles 275 can be located in the housing 255, e.g., on a floor, side wall, or ceiling of an interior of the housing 255. One or more nozzles can be positioned to clean the bottom surface of the pad conditioner disk, and/or the bottom surface, side-walls and/or and top surface of the conditioner head 93. The steam 295 can be generated using the steam generator 410. A drain 285 can permit excess water, cleaning solution, and cleaning by-product to pass through to prevent accumulation in the housing 255.

The conditioner head 93 and conditioner disk 92 can be lowered at least partially into the housing 255 to be steam treated. When the conditioner disk 92 is to be returned to operation, the conditioner head 93 and conditioning disk 92 are lifted out of the housing 255 and positioned on the polishing pad 30 to condition the polishing pad 30. When the conditioning operation is completed, the conditioner head 93 and conditioning disk 92 are lifted off the polishing pad and swung back to the housing cup 255 for the polishing by-product on the conditioner head 93 and conditioner disk 92 to be removed. In some implementations, the housing 255 is vertical actuatable, e.g., is mounted to a vertical drive shaft 260.

The housing 255 is positioned to receive the pad conditioner disk 92 and conditioner head 93. The conditioner disk 92 and conditioner head 93 can rotate within the housing 255, and/or move vertically in the housing 255, to allow the nozzles 275 to steam treat the various surfaces of the conditioning disk 92 and conditioner head 93.

The steam 295 delivered by the nozzles 275 can have an adjustable temperature, pressure, and/or flow rate. In some implementations, the temperature, pressure and/or flow rate can be independently adjustable for each nozzle or between groups of nozzles. This permits variation and thus more effective the cleaning of the conditioner disk 92 or conditioner head 93.

For example, the temperature of the steam 295 can be 90 to 200° C. when the steam 295 is generated (e.g., in the steam generator 410). The temperature of the steam 295 can be between 90 to 150° C. when the steam 295 is dispensed by the nozzles 275, e.g., due to heat loss in transit. In some implementations, steam can be delivered by the nozzles 275 at a temperature of 70-100° C., e.g., 80-90° C. In some implementations, the steam delivered by the nozzles is superheated, i.e., is at a temperature above the boiling point.

The flow rate of the steam 295 can be 1-1000 cc/minute when the steam 295 is delivered by the nozzles 275. In some implementations, the steam is mixed with other gases, e.g., is mixed with normal atmosphere or with $N_2$. Alternatively, the fluid delivered by the nozzles 275 is substantially purely water. In some implementations, the steam 295 delivered by the nozzles 275 is mixed with liquid water, e.g., aerosolized water. For example, liquid water and steam can be combined at a relative flow ratio (e.g., with flow rates in sccm) 1:1 to 1:10. However, if the amount of liquid water is low, e.g., less than 5 wt %, e.g., less than 3 wt %, e.g., less than 1 wt %, then the steam will have superior heat transfer qualities. Thus, in some implementations the steam is dry steam, i.e., does not include water droplets.

In some implementations, a temperature sensor 264 can be installed in or adjacent the housing 255 to detect the temperature of the conditioner head 93 and/or conditioner disk 92. The controller 12 can receive a signal from the temperature sensor 264 to monitor the temperature of the conditioner head 93 or conditioner disk 92, e.g., to detect the temperature of the pad conditioner disk 92. The controller 12 can control delivery of the steam by the assembly 250 based on the temperature measurement from the temperature sensor 264. For example, the controller can receive a target temperature value. If the controller 12 detects that the temperature measurement exceeds a target value, the controller 12 halt the flow of steam. As another example, the controller 12 can reduce the steam delivery flow rate and/or reduce the steam temperature, e.g., to prevent overheating of the components during cleaning and/or preheating.

In some implementations, the controller 12 uses a timer. In this case, the controller 12 can start the time when delivery of steam begins, and halt delivery of steam upon expiration of the timer. The timer can be set based on empirical testing to attain a desired temperature of the conditioner disk 92 during cleaning and/or preheating, e.g., to prevent overheating.

Referring to FIG. 3A, in some implementations, the polishing station 20 includes a temperature sensor 64 to monitor a temperature in the polishing station or a component of/in the polishing station, e.g., the temperature of the polishing pad 30 and/or slurry 38 on the polishing pad. For example, the temperature sensor 64 could be an infrared (IR) sensor, e.g., an IR camera, positioned above the polishing pad 30 and configured to measure the temperature of the polishing pad 30 and/or slurry 38 on the polishing pad. In particular, the temperature sensor 64 can be configured to measure the temperature at multiple points along the radius of the polishing pad 30 in order to generate a radial temperature profile. For example, the IR camera can have a field of view that spans the radius of the polishing pad 30.

In some implementations, the temperature sensor is a contact sensor rather than a non-contact sensor. For example, the temperature sensor 64 can be thermocouple or IR thermometer positioned on or in the platen 24. In addition, the temperature sensor 64 can be in direct contact with the polishing pad.

In some implementations, multiple temperature sensors could be spaced at different radial positions across the polishing pad 30 in order to provide the temperature at multiple points along the radius of the polishing pad 30. This technique could be use in the alternative or in addition to an IR camera.

Although illustrated in FIG. 3A as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the semiconductor wafer of the substrate 10. In some implementations, multiple temperature sensors are included in the polishing station 22, e.g., to measure temperatures of different components of/in the polishing station.

The polishing system 20 also includes a temperature control system 100 to control the temperature of the polishing pad 30 and/or slurry 38 on the polishing pad. The temperature control system 100 can include a cooling system 102 and/or a heating system 104. At least one, and in some implementations both, of the cooling system 102 and heating system 104 operate by delivering a temperature-controlled medium, e.g., a liquid, vapor or spray, onto the polishing surface 36 of the polishing pad 30 (or onto a polishing liquid that is already present on the polishing pad).

For the cooling system 102, the cooling medium can be a gas, e.g., air, or a liquid, e.g., water. The medium can be at room temperature or chilled below room temperature, e.g., at 5-15° C. In some implementations, the cooling system 102 uses a spray of air and liquid, e.g., an aerosolized spray of liquid, e.g., water. In particular, the cooling system can have nozzles that generate an aerosolized spray of water that is chilled below room temperature. In some implementations, solid material can be mixed with the gas and/or liquid. The solid material can be a chilled material, e.g., ice, or a material that absorbs heat, e.g., by chemical reaction, when dissolved in water.

The cooling medium can be delivered by flowing through one or more apertures, e.g., holes or slots, optionally formed in nozzles, in a coolant delivery arm. The apertures can be provided by a manifold that is connected to a coolant source.

As shown in FIGS. 3A and 3B, an example cooling system 102 includes an arm 110 that extends over the platen 24 and polishing pad 30 from an edge of the polishing pad to or at least near (e.g., within 5% of the total radius of the polishing pad) the center of polishing pad 30. The arm 110 can be supported by a base 112, and the base 112 can be supported on the same frame 40 as the platen 24. The base 112 can include one or more an actuators, e.g., a linear actuator to raise or lower the arm 110, and/or a rotational actuator to swing the arm 110 laterally over the platen 24. The arm 110 is positioned to avoid colliding with other hardware components such as the polishing head 70, pad conditioning disk 92, and the slurry dispensing arm 39.

The example cooling system 102 includes multiple nozzles 120 suspended from the arm 110. Each nozzle 120 is configured to spray a liquid coolant medium, e.g., water, onto the polishing pad 30. The arm 110 can be supported by a base 112 so that the nozzles 120 are separated from the polishing pad 30 by a gap 126.

Each nozzle 120 can be configured to direct aerosolized water in a spray 122 toward the polishing pad 30. The cooling system 102 can include a source 130 of liquid coolant medium and a gas source 132 (see FIG. 3B). Liquid from the source 130 and gas from the source 132 can be mixed in a mixing chamber 134 (see FIG. 3A), e.g., in or on the arm 110, before being directed through the nozzle 120 to form the spray 122.

In some implementations, a process parameter, e.g., flow rate, pressure, temperature, and/or mixing ratio of liquid to gas, can be independently controlled for each nozzle. For example, the coolant for each nozzle 120 can flow through an independently controllable chiller to independently control the temperature of the spray. As another example, a separate pair of pumps, one for the gas and one for the liquid, can be connected to each nozzle such that the flow rate, pressure and mixing ratio of the gas and liquid can be independently controlled for each nozzle.

The various nozzles can spray onto different radial zones 124 on the polishing pad 30. Adjacent radial zones 124 can overlap. In some implementations, the nozzles 120 generate a spray impinges the polishing pad 30 along an elongated region 128. For example, the nozzle can be configured to generate a spray in a generally planar triangular volume.

One or more of the elongated region 128, e.g., all of the elongated regions 128, can have a longitudinal axis parallel to the radius that extends through the region 128 (see region 128a). Alternatively, the nozzles 120 generate a conical spray.

Although FIG. 1 illustrates the spray itself overlapping, the nozzles 120 can be oriented so that the elongated regions do not overlap. For example, at least some nozzles 120, e.g., all of the nozzles 120, can be oriented so that the elongated region 128 is at an oblique angle relative to the radius that passes through the elongated region (see region 128b).

At least some nozzles 120 can be oriented so that a central axis of the spray (see arrow A) from that nozzle is at an oblique angle relative to the polishing surface 36. In particular, spray 122 can be directed from a nozzle 120 to have a horizontal component in a direction opposite to the direction of motion of polishing pad 30 (see arrow A) in the region of impingement caused by rotation of the platen 24.

Although FIGS. 3A and 3B illustrate the nozzles 120 as spaced at uniform intervals, this is not required. The nozzles 120 could be distributed non-uniformly either radially, or angularly, or both. For example, the nozzles 120 can clustered more densely along the radial direction toward the edge of the polishing pad 30. In addition, although FIGS. 3A and 3B illustrate nine nozzles, there could be a larger or smaller number of nozzles, e.g., three to twenty nozzles.

For the heating system 104, the heating medium can be a gas, e.g., steam (e.g., from the steam generator 410) or heated air, or a liquid, e.g., heated water, or a combination of gas and liquid. The medium is above room temperature, e.g., at 40-120° C., e.g., at 90-110° C. The medium can be water, such as substantially pure de-ionized water, or water that that includes additives or chemicals. In some implementations, the heating system 104 uses a spray of steam. The steam can includes additives or chemicals.

The heating medium can be delivered by flowing through apertures, e.g., holes or slots, e.g., provided by one or more nozzles, on a heating delivery arm. The apertures can be provided by a manifold that is connected to a source of the heating medium.

An example heating system 104 includes an arm 140 that extends over the platen 24 and polishing pad 30 from an edge of the polishing pad to or at least near (e.g., within 5% of the total radius of the polishing pad) the center of polishing pad 30. The arm 140 can be supported by a base 142, and the base 142 can be supported on the same frame 40 as the platen 24. The base 142 can include one or more an actuators, e.g., a linear actuator to raise or lower the arm 140, and/or a rotational actuator to swing the arm 140 laterally over the platen 24. The arm 140 is positioned to avoid colliding with other hardware components such as the polishing head 70, pad conditioning disk 92, and the slurry dispensing arm 39.

Along the direction of rotation of the platen 24, the arm 140 of the heating system 104 can be positioned between the arm 110 of the cooling system 102 and the carrier head 70. Along the direction rotation of the platen 24, the arm 140 of the heating system 104 can be positioned between the arm 110 of the cooling system 102 and the slurry delivery arm 39. For example, the arm 110 of the cooling system 102, the arm 140 of the heating system 104, the slurry delivery arm 39 and the carrier head 70 can be positioned in that order along the direction rotation of the platen 24.

Multiple openings 144 are formed in the bottom surface of the arm 140. Each opening 144 is configured to direct a gas or vapor, e.g., steam, onto the polishing pad 30. The arm 140 can be supported by a base 142 so that the openings 144 are separated from the polishing pad 30 by a gap. The gap can be 0.5 to 5 mm. In particular, the gap can be selected such that the heat of the heating fluid does not significantly dissipate before the fluid reaches the polishing pad. For example, the gap can be selected such that steam emitted from the openings does not condense before reaching the polishing pad.

The heating system 104 can include a source 148 of steam, e.g., the steam generator 410, which can be connected to the arm 140 by tubing. Each opening 144 can be configured to direct steam toward the polishing pad 30.

In some implementations, a process parameter, e.g., flow rate, pressure, temperature, and/or mixing ratio of liquid to gas, can be independently controlled for each nozzle. For example, the fluid for each opening 144 can flow through an independently controllable heater to independently control the temperature of the heating fluid, e.g., the temperature of the steam.

The various openings 144 can direct steam onto different radial zones on the polishing pad 30. Adjacent radial zones can overlap. Optionally, some of the openings 144 can be oriented so that a central axis of the spray from that opening is at an oblique angle relative to the polishing surface 36. Steam can be directed from one or more of the openings 144 to have a horizontal component in a direction opposite to the direction of motion of polishing pad 30 in the region of impingement as caused by rotation of the platen 24.

Although FIG. 3B illustrates the openings 144 as spaced at even intervals, this is not required. The nozzles 120 could be distributed non-uniformly either radially, or angularly, or both. For example, openings 144 could be clustered more densely toward the center of the polishing pad 30. As another example, openings 144 could be clustered more densely at a radius corresponding to a radius at which the polishing liquid 38 is delivered to the polishing pad 30 by the slurry delivery arm 39. In addition, although FIG. 3B illustrates nine openings, there could be a larger or smaller number of openings.

The polishing system 20 can also include a high pressure rinse system 106. The high pressure rinse system 106 includes a plurality of nozzles 154, e.g., three to twenty nozzles that direct a cleaning fluid, e.g., water, at high intensity onto the polishing pad 30 to wash the pad 30 and remove used slurry, polishing debris, etc.

As shown in FIG. 3B, an example rinse system 106 includes an arm 150 that extends over the platen 24 and polishing pad 30 from an edge of the polishing pad to or at least near (e.g., within 5% of the total radius of the polishing pad) the center of polishing pad 30. The arm 150 can be supported by a base 152, and the base 152 can be supported on the same frame 40 as the platen 24. The base 152 can include one or more an actuators, e.g., a linear actuator to raise or lower the arm 150, and/or a rotational actuator to swing the arm 150 laterally over the platen 24. The arm 150 is positioned to avoid colliding with other hardware components such as the polishing head 70, pad conditioning disk 92, and the slurry dispensing arm 39.

Along the direction of rotation of the platen 24, the arm 150 of the rinse system 106 can be between the arm 110 of the cooling system 102 and the arm 140 of the heating system 104. For example, the arm 110 of the cooling system 102, the arm 150 of the rinse system 106, the arm 140 of the heating system 104, the slurry delivery arm 39 and the carrier head 70 can be positioned in that order along the direction rotation of the platen 24. Alternatively, along the direction of rotation of the platen 24, the arm 140 of the cooling system 102 can be between the arm 150 of the rinse system 106 and the arm 140 of the heating system 104. For example, the arm 150 of the rinse system 106, the arm 110 of the cooling system 102, the arm 140 of the heating system 104, the slurry delivery arm 39 and the carrier head 70 can be positioned in that order along the direction rotation of the platen 24.

Although FIG. 3B illustrate the nozzles 154 as spaced at even intervals, this is not required. In addition, although FIGS. 3A and 3B illustrate nine nozzles, there could be a larger or smaller number of nozzles, e.g., three to twenty nozzles.

The polishing system 2 can also include the controller 12 to control operation of various components, e.g., the temperature control system 100. The controller 12 is configured to receive the temperature measurements from the temperature sensor 64 for each radial zone of the polishing pad. The controller 12 can compare the measured temperature profile to a desired temperature profile, and generate a feedback signal to a control mechanism (e.g., actuator, power source, pump, valve, etc.) for each nozzle or opening. The feedback signal is calculated by the controller 12 e.g., based on an internal feedback algorithm, to cause the control mechanism to adjust the amount of cooling or heating such that the polishing pad and/or slurry reaches (or at least moves closer to) the desired temperature profile.

In some implementations, the polishing system 20 includes a wiper blade or body 170 to evenly distribute the polishing liquid 38 across the polishing pad 30. Along the direction of rotation of the platen 24, the wiper blade 170 can be between the slurry delivery arm 39 and the carrier head 70.

FIG. 3B illustrates separate arms for each subsystem, e.g., the heating system 102, cooling system 104 and rinse system 106, various subsystems can be included in a single assembly supported by a common arm. For example, an assembly can include a cooling module, a rinse module, a heating module, a slurry delivery module, and optionally a wiper module. Each module can include a body, e.g., an arcuate body, that can be secured to a common mounting plate, and the common mounting plate can be secured at the end of an arm so that the assembly is positioned over the polishing pad 30. Various fluid delivery components, e.g., tubing, passages, etc., can extend inside each body. In some implementations, the modules are separately detachable from the mounting plate. Each module can have similar components to carry out the functions of the arm of the associated system described above.

Referring to FIGS. 1, 2A, 2B, 3A and 3B, the controller 12 can monitor the temperature measurements received by the sensors 64, 214, and 264 and control the temperature control system 100 and amount of steam delivered to the steam treating assembly 200 and 250. The controller 12 can continuously monitor the temperature measurements and control the temperature in a feedback loop, to tune the temperature of the polishing pad 30, the carrier head 70, and the conditioning disk 92. For example, the controller 12 can receive the temperature of the polishing pad 30 from the sensor 64, and control the delivery of steam onto the carrier head 70 and/or conditioner head 92 to raise the temperatures of the carrier head 70 and/or the conditioner head 92 to match the temperature of the polishing pad 30. Reducing the temperature difference can help prevent the carrier head 70 and/or the conditioner head 92 from acting as heat sinks on a relatively higher temperature polishing pad 30, and can improve within-wafer uniformity.

In some embodiments, the controller 12 stores a desired temperature for the polishing pad 30, the carrier head 70, and the conditioner disk 92. The controller 12 can monitor the temperature measurements from the sensors 64, 214, and 264 and control the temperature control system 100 and the steam treating assembly 200 and/or 250 to bring the temperatures of the polishing pad 30, the carrier head 70, and/or the conditioner disk 92 to the desired temperature. By causing the temperatures to achieve a desired temperature, the controller 12 can improve within-wafer uniformity and wafer-to-wafer uniformity.

Alternatively, the controller 12 can raise the temperatures of the carrier head 70 and/or the conditioner head 92 to slightly above the temperature of the polishing pad 30, to allow for the carrier head 70 and/or the conditioner head 92 to cool to the same or substantially the same temperature of the polishing pad 30 as they move from their respective cleaning and pre-heating stations to the polishing pad 30.

A number of embodiments of the invention have been described. Nevertheless, it will be understood that various modifications may be made without departing from the spirit and scope of the invention. Accordingly, other embodiments are within the scope of the following claims.

What is claimed is:

1. An apparatus for steam treatment of a conditioner head and/or conditioner disk in a chemical mechanical polishing system, comprising:
   a cleaning cup having a cavity that is open at top and that is sized and positioned to receive the conditioner head of the chemical mechanical polishing system;
   a boiler to generate steam;
   one or more nozzles positioned to direct steam inwardly into the cavity defined by the cleaning cup and onto the conditioner head and/or the conditioner disk held by the conditioner head when positioned in the cleaning cup; and
   a supply line running from the boiler to the one or more nozzles to supply steam to the one or more nozzles.

2. The apparatus of claim 1, further comprising the conditioner head, and wherein the conditioner head is rotatable within the cleaning cup.

3. The apparatus of claim 1, further comprising a vertically actuatable drive shaft to lift and lower the conditioner head within the cleaning cup.

4. The apparatus of claim 1, comprising a temperature sensor to monitor a temperature of the conditioner head and/or conditioner disk.

5. The apparatus of claim 4, comprising a controller configured to receive the temperature from the sensor and to halt a flow of steam to the conditioner head or conditioner disk when the conditioner head or conditioner disk reaches a target temperature.

6. The apparatus of claim 1, further comprising a controller configured to start a timer when the steam begins to flow onto conditioner head or conditioner disk and to halt the flow of steam when the timer expires.

7. The apparatus of claim 1, wherein the one or more nozzles include a first nozzle, and further comprising a controller is configured to cause steam to flow through the first nozzle onto a bottom surface of the conditioner disk when the conditioner head is positioned in the cleaning cup.

8. The apparatus of claim 1, wherein the one or more nozzles include a second nozzle, and further comprising a controller configured to cause steam to flow through the second nozzle onto an outer surface of the conditioner head when the conditioner head is positioned in the cleaning cup.

9. The apparatus of claim 1, wherein at least one nozzle of the one or more nozzles is located on a floor of the cleaning cup.

10. The apparatus of claim 1, wherein at least one nozzle of the one or more nozzles is located on a side wall of the cleaning cup.

11. A chemical mechanical polishing system, comprising:
- a platen to support a polishing pad;
- a carrier head to hold a substrate in contact with the polishing pad;
- a conditioner system including a base and a conditioner head configured to hold a conditioner disk, the conditioner head connected to the base by a movable arm;
- a cleaning cup having a cavity that is open at top and that is sized and positioned to receive the conditioner head, wherein the conditioner head is movable by the arm from a first position over the polishing pad to a second position over the cleaning cup;
- a boiler to generate steam;
- one or more nozzles positioned to direct steam inwardly into the cavity defined by the cleaning cup and onto the conditioner head and/or the conditioner disk held by the conditioner head when positioned in the cleaning cup; and
- a supply line running from the boiler to the one or more nozzles to supply steam to the one or more nozzles.

12. The system of claim 11, further comprising a vertically actuatable drive shaft to lift the conditioner head out of the cleaning cup and lower the conditioner head into the cleaning cup.

13. The system of claim 11, wherein the cleaning cup is vertically actuatable such that the cleaning cup is liftable to surround the conditioner head and lowerable below the conditioner head.

14. The system of claim 11, wherein at least one nozzle of the one or more nozzles is located on a floor of the cleaning cup.

15. The system of claim 11, wherein at least one nozzle of the one or more nozzles is located on a side wall of the cleaning cup.

* * * * *